United States Patent
Bojarczuk, Jr. et al.

(10) Patent No.: US 6,255,671 B1
(45) Date of Patent: Jul. 3, 2001

(54) METAL EMBEDDED PASSIVATION LAYER STRUCTURE FOR MICROELECTRONIC INTERCONNECT FORMATION, CUSTOMIZATION AND REPAIR

(75) Inventors: Nestor Alexander Bojarczuk, Jr., Poughkeepsie; Supratik Guha, Yorktown Heights; Arunava Gupta, Valley Cottage; Sampath Purushothaman, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/002,840

(22) Filed: Jan. 5, 1998

(51) Int. Cl.$^7$ .............................. H01L 33/00; H01L 21/28
(52) U.S. Cl. .......................... 257/103; 257/615; 257/613; 438/604; 438/605; 438/662
(58) Field of Search ...................................... 438/618, 660, 438/600, 598, 662, 604, 606, 605, 607; 257/630, 533, 534, 537, 745, 506, 508, 760, 103, 615, 613

(56) References Cited

U.S. PATENT DOCUMENTS

| | | | |
|---|---|---|---|
| 4,072,532 | * 2/1978 | Fletcher et al. | 106/65 |
| 4,706,377 | * 11/1987 | Shuskus . | |
| 5,145,741 | * 9/1992 | Quick | 428/402 |
| 5,225,251 | * 7/1993 | Esrom . | |
| 5,459,098 | * 10/1995 | Maya | 438/618 |
| 5,602,418 | * 2/1997 | Imai et al. | 257/627 |
| 5,616,421 | * 4/1997 | Sawtell et al. | 428/614 |
| 5,863,811 | * 1/1999 | Kawai et al. | 438/47 |
| 5,874,147 | 2/1999 | Bojarczuk, Jr. et al. | 428/64.1 |
| 5,886,367 | * 3/1999 | Udagawa | 257/64 |

OTHER PUBLICATIONS

L. Maya, et al. "Gold nanocomposites" J. Vac. Sci. & Tech. B; vol. 13, No. 2; pp. 361–365, Apr. 1995.*

* cited by examiner

Primary Examiner—Caridad Everhart
(74) Attorney, Agent, or Firm—Casey P. August, Esq.; Perman & Green, LLP

(57) ABSTRACT

A structure includes a metal nitride film of the form MN, where M is selected from the group consisting of Ga, In, AlGa, AlIn, and AlGaIn. The structure has at least one electrically conductive metal region that is formed within and from the metal nitride film by a thermal process driven by absorption of light having a predetermined wavelength. Single films comprised of AlN are also within the scope of this invention, wherein an Al trace or interconnect is formed by laser radiation of wavelength 248 nm so as to contact circuitry that exists under the film. Multilayered stacks of films are also within the scope of the teachings of this invention. In this case each film layer may be separately deposited and then illuminated to selectively form the desired electrical connection(s), which may also connect to conductive feature(s) in an underlying layer, or a plurality of metal nitride layers are stacked bottom to top in order of increasing electronic band gap energy value, and then the conductive features are written into selective ones of the layers by controlling the wavelength of the light to be absorbed in a desired layer. The teachings of this invention can be employed to fabricate fuses and anti-fuses enabling selective circuit customization, test and repair. Also disclosed is a technique for forming electrical resistors in a metal nitride layer by adjusting the electrical resistance of the metallization formed from the metal nitride film layer.

24 Claims, 4 Drawing Sheets

METAL EMBEDDED PASSIVATION LAYER STRUCTURE FOR MICROELECTRONIC INTERCONNECT FORMATION, CUSTOMIZATION AND REPAIR

FIELD OF THE INVENTION

This invention relates generally to microelectronic device fabrication methodologies and, in particular, to the formation of protective passivation layers that are applied to surfaces of microelectronic devices, such as integrated circuits and chip carriers, as well as to the formation of conductive interconnects and resistance elements.

BACKGROUND OF THE INVENTION

Passivation layers are used in a wide range of semiconductor CMOS and bipolar devices and packages. The primary function of a passivation layer is to hermetically seal and/or electrically isolate semiconductor devices/circuits in a multi-layer stack.

There are two general types of passivating layers that are currently used. The first type comprises inorganic nitrides and oxides which are generally hard, chemically inert, and impervious to moisture. These materials exhibit an adequate thermal conductivity as well as a high electrical resistivity and a high dielectric breakdown strength that provides excellent electrical isolation. However, the first type of passivating layers usually require high temperature processing for their deposition (>400 C.). Furthermore, in many cases the materials are non-transparent, thereby complicating certain processing steps involving lithography.

The second type of passivating layers comprise organic polymers, such as polyimide. In general these polymers are soft, partially transparent, are not totally impervious to moisture and certain solvents, acids, or bases, and are limited to use at low temperatures (<350 C.). However, their ease of deposition makes them an attractive choice in a number of applications.

Both of the above types of passivation layers require standard photolithography processing if they are to be patterned. Patterning is necessary in many applications in order to make metal contacts through the passivation layer to connect the upper metal layer on microelectronics devices to layers below. However, patterning introduces a number of additional steps such as photoresist deposition, photolithography, and reactive ion or wet chemical etching to produce contact holes in the insulator and metallization to facilitate electrical connection. Further, the contact hole topography and edge profile can affect the extent to which the metallization conformally covers same, and can also affect the contact resistance and reliability of the interconnection between levels. While shallower wall profiles in thin insulator layers are generally most conducive to achieving good step coverage, steep wall profiles are required in order to achieve a high area density of contacts. Furthermore, providing a good dielectric breakdown voltage necessitates the use of thicker insulators. These conflicting requirements detrimentally limit the choice of metallization processes as well as an upper bound on practical contact densities in devices. Consequently, there is a long-felt need for a robust, transparent and impervious passivation layer that can be easily deposited, patterned and interconnected in fewer process steps. It is further desirable to achieve a contact hole and metal fill structure in a coplanar morphology to avoid the above-mentioned step coverage related issues.

Aluminum nitride is hard, robust, chemically inert, optically transparent, impervious to moisture, and exhibits a high thermal conductivity and electrical resistivity. That is, the use of AlN provides a passivation layer having excellent mechanical, thermal and dielectric properties. The physical properties of AlN are shown in Table 1.

TABLE 1

Properties of AlN

| | |
|---|---|
| Hardness | 7 Mohs/1200 Knoop |
| Resistivity | $10^{13}$ Ohms/cm |
| Dielectric Constant | 8.5 |
| Thermal Conductivity | 0.3 W/cm K |
| Solubility | Impervious to most acids and bases |

In addition, AlN has the property that when exposed to ultraviolet radiation above a certain power density, for example greater than 100 mJ/cm$^2$, the nitrogen in the AlN preferentially desorbs leaving behind a thin film of Al. This property was observed in bulk AlN by Li et al., Mat. Res. Soc. Symp. Proc. 390, 257 (1995).

In U.S. Pat. No. : 5,225,251, issued Jul. 6, 1993, entitled "Method for Forming Layers by UV Radiation of Aluminum Nitride", H. Esrom describes a process for irradiating an aluminum nitride layer with ultraviolet radiation in the range from 240 nm to 270 nm, resulting in the elimination of the nitrogen component from the aluminum nitride for forming an aluminum layer. The aluminum layer is then reinforced with another metal using a metal deposition process.

OBJECTS AND ADVANTAGES OF THE INVENTION

It is a first object and advantage of this invention to provide an improved passivation layer that overcomes the foregoing and other problems.

It is a further object and advantage of this invention to provide a process that uses a metal nitride passivation material, in which process electrically conductive features, which may have a controlled value of resistance, are fabricated within the passivation material using a thermal process.

It is another object and advantage of this invention to provide a process that uses one or a stack of Group III metal nitride films, in which process electrically conductive metal circuit interconnects are fabricated within the film or films using electromagnetic radiation having wavelengths selected for causing illuminated portions of the film(s) to convert to the Group III metal or metals.

SUMMARY OF THE INVENTION

The foregoing and other problems are overcome and the objects of the invention are realized by methods and apparatus in accordance with embodiments of this invention, wherein a structure includes a metal nitride film of the form MN, where M is selected from the group consisting of Ga, In, AlGa, AlIn, and AlGaIn. The structure has at least one electrically conductive metal region that is formed within and from the metal nitride film by a thermal process driven by absorption of light having a predetermined wavelength. Single films comprised of AlN are also within the scope of this invention, wherein an Al trace or interconnect is formed by laser radiation of wavelength 248 nm so as to electrically contact circuitry that exists under the film. The use of multi-layered stacks of films are also within the scope of the teachings of this invention. In this case each film layer may be separately deposited and then illuminated to selectively form the desired electrical connection(s), which may also connect to conductive feature(s) in an underlying layer, or a plurality of metal nitride layers are stacked bottom to top in order of increasing electronic band gap energy value, and then conductive features are written into selective ones of the layers by controlling the wavelength of the light to be absorbed in a desired layer. The teachings of this invention can be employed to fabricate fuses and anti-fuses enabling selective circuit customization, test and repair.

Also disclosed is a technique for forming electrical resistors in a metal nitride layer by adjusting the electrical resistance of the metallization formed from the metal nitride film layer.

BRIEF DESCRIPTION OP THE DRAWINGS

The above set forth and other features of the invention are made more apparent in the ensuing Detailed Description of the Invention when read in conjunction with the attached Drawings, wherein:

FIG. 5b is a cross-sectional representation of irradiated MN regions converted to metal which contacts the underlying Al film of FIG. 5a.

DETAILED DESCRIPTION OF THE INVENTION

The teachings of this invention provide a novel passivation process that employs a Group III metal nitride of the form MN, where M can be one of Ga, In, AlGa, AlIn, and AlGaIn, which can be patterned in two steps (deposition and write). The patterning steps require significantly shorter times to perform than the conventional processes used for fabricating passivation coatings and subsequent metallization for chips, chip carriers, and other microelectronic devices. The writing process can be used to create an electrically conductive metallization region that is embedded in the MN insulator in a coplanar fashion. This is accomplished using an in-situ metallization technique that locally converts insulating MN to the constituent Group III metal or metals by laser irradiation.

The inventors have exploited properties of the nitrides of the Group III metals in the processing of thin films of MN to provide a one step contact etch/metallization process. It is also within the scope of the teaching of this invention to provide multi-layered stacks of MN layers, such as layers of AlN, and to form interconnects between layers and/or to conductive circuit features disposed beneath the layer. It is further within the scope of the teaching of this invention to form regions having a selected resistance within a MN film, such as when one wishes to locate a terminating resistance at an end of an electrically conductive trace.

Figure 1:
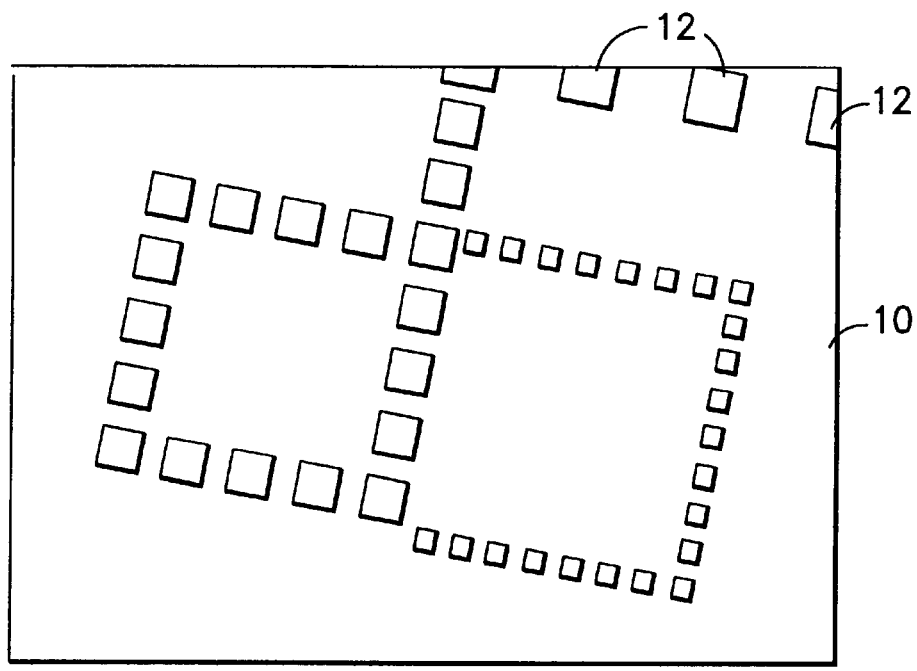
FIG. 1 is top view of an irradiated MN (metal nitride) film showing metallized structures made with a laser beam.

FIG. 1 illustrates a top view of a MN surface layer 10 having metallization regions 12 of various sizes embedded therein. The layer 10 was a thin film that was selectively metallized by exposure to a focused beam from a pulsed excimer laser operating at a wavelength of, by example, 248 nm. The metallization depth of the regions 12 was measured by etching away the metal regions 12 in a chemical solution that did not attack the MN (e.g., aqua regia). The depth of the resulting "holes" in the surface layer was determined by a surface profiler, and was found to be about 150 nm to about 200 nm. The metallization depth is believed to be limited by the absorption depth for the photons.

For example, the band gap of AlN at room temperature is 6.2 eV, which corresponds to a photon wavelength of 200 nm. On the other hand, AlN absorption appears to occur at 248 nm or, equivalently, 5 eV. Absorption at this lower value is believed to be due to the presence of states in the band gap and also to the highly non-equilibrium nature of the reaction. The incidence of a short pulse of intense radiation can create instantaneous local temperature spikes and consequently can shift the band gap to lower energies. Other factors, such as disordering of the local bonding configuration during light absorption, can also shift the band edge.

These properties of MN are exploited to advantage in fabricating passivation coating films for microelectronic devices with a two-step photoresist-free patterning process to create a coplanar contact metallization that connects to the metallization below, thus simplifying the fabrication process.

The thin film insulator-to-metal conversion process in accordance with this invention can similarly be used for the interconnection of circuits on a chip for making repairs and for chip personalization. In addition, MN passivation layers allow for "burn once/repair once" fuses, as opposed to the "burn once" fuses that are used at present.

In a presently preferred fabrication process a device that is ready for a passivation coating operation is inserted into a vacuum chamber and the MN layer 10 is deposited on its surface (held at room temperature) either by: sputtering the Group III metal(s), such as Al, in a nitrogen plasma environment; or by evaporating the Group III metal(s) and directing a beam of plasma excited nitrogen onto the surface; or by evaporating the Group III metal(s) through a nitrogen plasma plume created by a local plasma discharge in the vacuum chamber. Any of these deposition methods, or others of a suitable nature, can be employed for the MN deposition step. Following the deposition of a suitable thickness of the MN film 10, the device is removed from the vacuum chamber and selectively metallized by either: (a) irradiating the surface of the MN layer with a broad beam of ultraviolet laser light through a proximity or contact mask placed over the MN layer surface or by the projection of the desired pattern on the surface; or by (b) scanning a focused beam across the MN layer surface in a desired line or pad shape to form the metallization region(s) 12. These two approaches (blanket illumination or scanned illumination) are shown in FIGS. 2 and 3, respectively.

Figure 2:
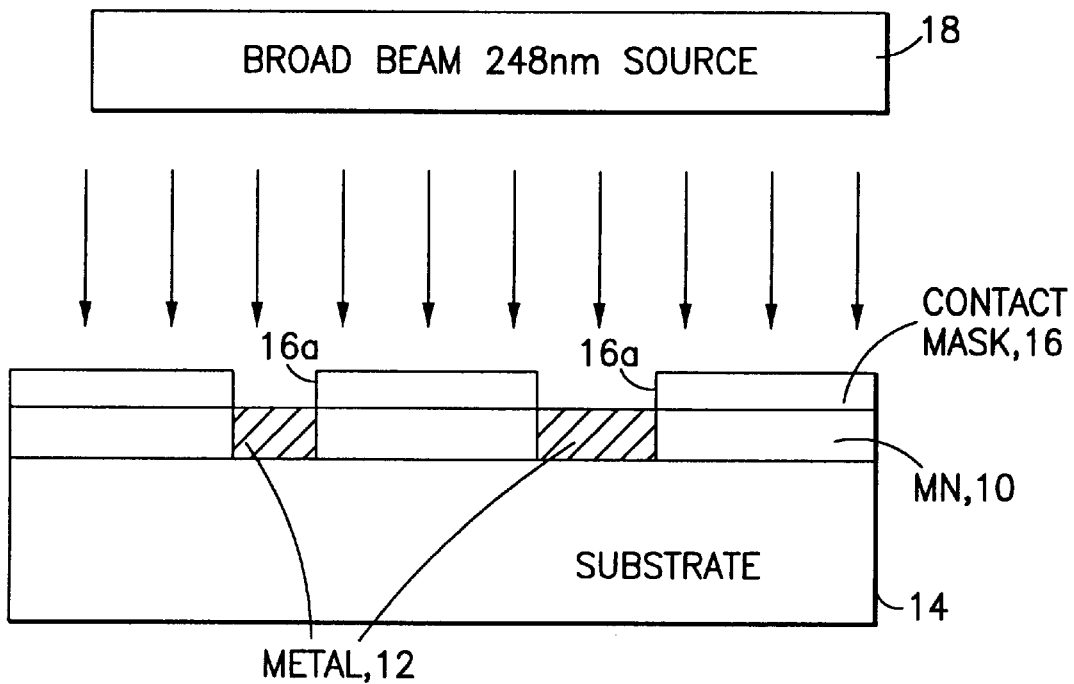
FIG. 2 is a schematic representation of a broad beam source utilizing a shadow mask to obtain desired structures in the MN film.

FIG. 2 shows the MN layer 10 disposed over a surface of a substrate 14, and an apertured contact mask 16 placed over the MN layer 10. A broad beam UV source 18 is positioned for illuminating the exposed portions of the MN layer through apertures 16a in the contact mask 16. The metal regions 12 are formed in and from the MN layer 10 in registration with the apertures 16a.

Figure 3:
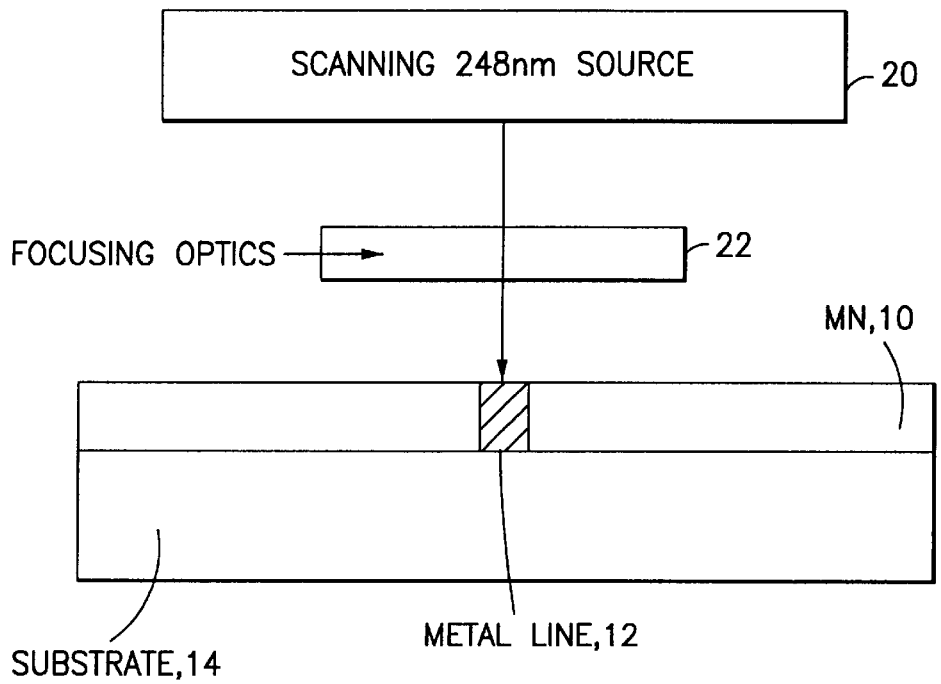
FIG. 3 is a schematic representation of a focused scanning source used to obtain the desired structures in the MN film.

In FIG. 3 the broad band source 18 is replaced by a scanning source 20 that provides a beam though focusing optics 22 to the MN layer 10. The contact mask 16 can thus be eliminated. In this case an electrically conductive metal line is "drawn" into the MN layer 10 by causing relative motion between the focused UV beam from the source 20 and the substrate 14.

In either embodiment the result is a metallization depth equal to the thickness of the MN thin film 10 assuming an appropriate radiation dose. Thus, by this process one can create coplanar metal interconnect regions 12 that are embedded in the MN passivating layer 10. The metal regions 12 may connect to electrically conductive (e.g., metal) features in levels below the MN passivation layer 10, thus facilitating access to the underlying circuitry.

Figure 4:
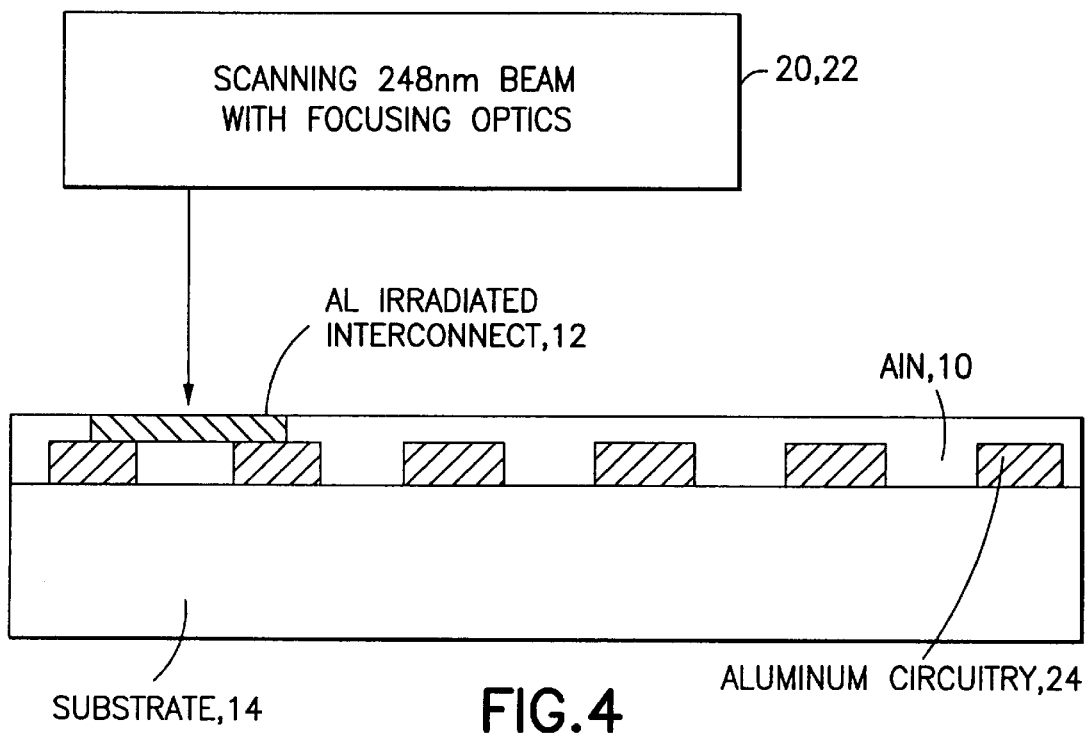
FIG. 4 is a cross-sectional representation of interconnecting metal circuitry encapsulated in a MN passivation film layer, the metal interconnects being fabricated in conjunction with the scanning source of FIG. 3.

By example, and referring to FIG. 4, the MN thin film layer 10, such as a layer of AlN, is deposited over Al circuitry and interconnects 24 that are present on the surface of the substrate 14. The scanning source and focusing optics 20, 22 are employed to write a metal interconnect 12' into the MN film 10 for selectively electrically coupling two of the Al circuits 24 to one another.

The teaching of this invention can be seen to provide a simple technique that forms the passivation coating 10 and the level to level interconnection 12' in two steps that are compatible with CMOS, bipolar back end of line processing, and multichip module fabrication.

EXAMPLE

Figure 5A:
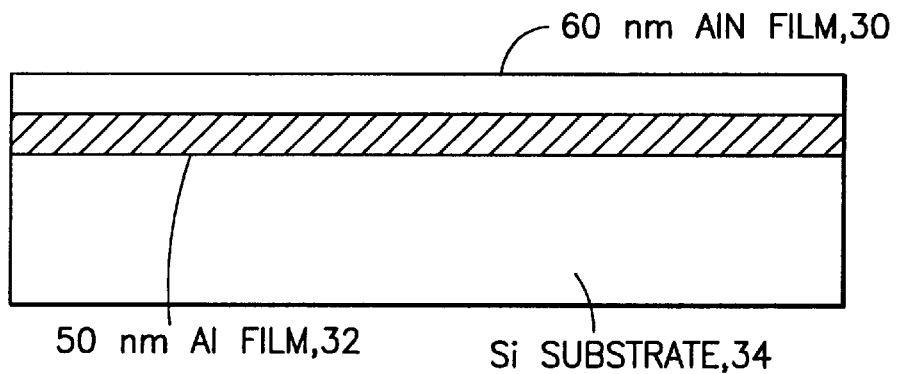
FIG. 5a is a cross-sectional representation of a 60 nm MN film on a 50 nm film of Al metal over a Si wafer.
Figure 5B:
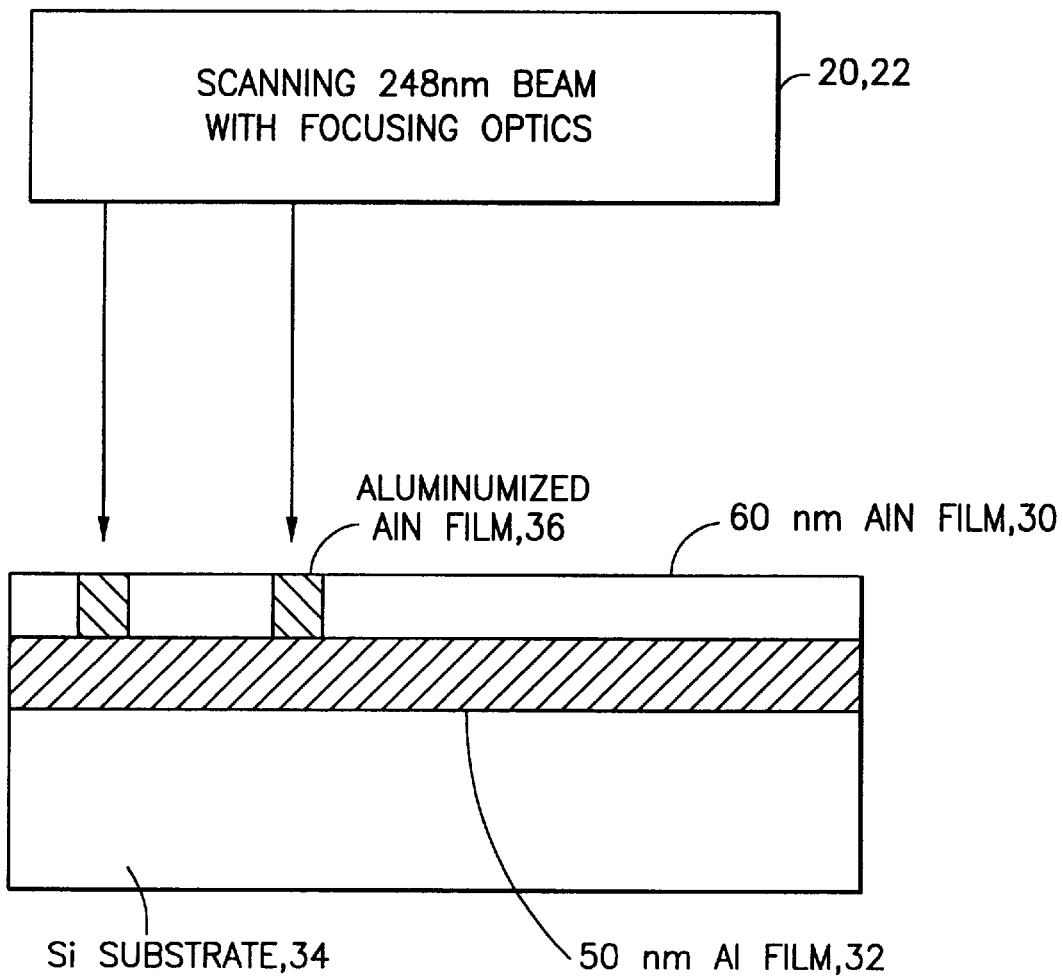
Figure 5C:
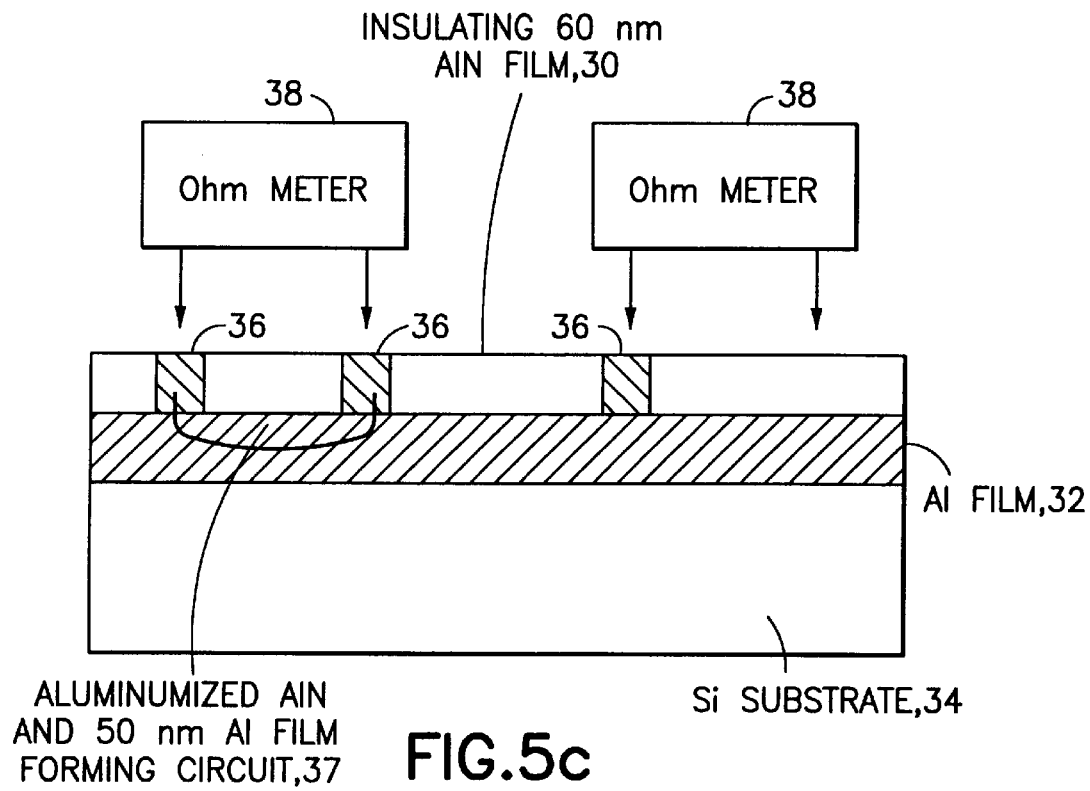
FIG. 5c is a cross-sectional view of the metallized regions making contact with the underlying Al film to form a conducting circuit, and also a representation of a nonconducting circuit from a metallized region to the surrounding MN film.

A 60 nm thick AlN film 30 was deposited on top of a 50 nm thick metallic Al film 32 grown on a Si substrate 34 (FIG. 5a). Using an excimer laser with a fluence of approximately 200 mJ per $cm^2$ (represented by the scanned source and focusing optics 20, 22) a plurality of regions of the AlN film 30 were converted to metallic regions 36. Resistance measurements made by electrical probe contacts (shown as an Ohm meter 38) to the converted metal regions 36 showed that any two converted metal regions 36 are electrically coupled through the underlying Al film 32, thereby forming a circuit 37. The unconverted MN regions, however, were found to remain insulating.

The inventors have determined that Group III–V nitrides, such as GaN (SAM 49/51/69) and InN (SAM 87), can also be converted to metallic layers by laser irradiation. Because of the smaller band gap in these materials they absorb laser radiation at longer wavelengths. Thus, these materials can be converted to the corresponding metallic form at wavelengths greater than 248 nm. A mixed composition (Al,Ga,In)N film, with different proportions of Al, Ga, and In, enables the band gap to be tunable, thus providing wavelength selectivity for the conversion process. This wavelength selectivity can be exploited for the processing of multiple layers with different compositions. By judiciously stacking different passivation layers one can achieve local metallization in buried levels by using tunable wavelength laser radiation that is transmitted through the upper layer(s), while being absorbed strongly to result in metallic conversion at a desired buried layer. In general, a plurality of metal nitride layers are stacked bottom to top in order of increasing electronic band gap energy value.

More particularly, although the band gaps of nitrides with single column three metals are single valued, e.g., 1.9 eV for InN, 3.4 eV for GaN and 6.2 eV for AlN, it has been found that alloys of these metals with nitrogen have band gaps that can be adjusted (tuned) by varying the ratios of the metals in the alloy. Thus, film layers made from these alloys can be compositionally tuned for a desired band gap for operation with photon energies that can be selected anywhere in the band gap range. In the case of InGaAlN, this range can vary from 1.9 to 6.2 ev. For instance, if the laser wavelength is 380 nm (or 3.25 eV photon energy), an $In_{0.7}Al_{0.3}N$ alloy would be useable since it corresponds to a band gap energy of 3.25 eV. The metal remaining after denitridation would be an alloy of Al and In. Generally, these materials or alloys have the composition $A_xB_yC_{1-x-y}N$ where A, B, and C are different column III metals and x and y are numbers between 0 and 1.

Figure 6:
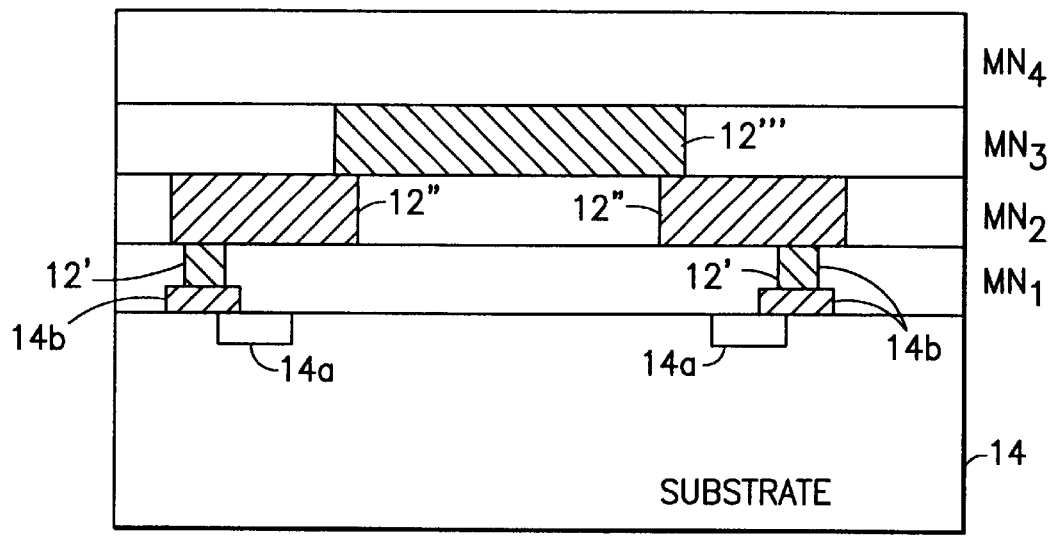
FIG. 6 is a cross-sectional view of a multilayered film stack having metal interconnects selectively formed in different ones of the films.

FIG. 6 is a cross-sectional view of a multi-layered film stack having metal interconnects selectively formed in different ones of the films. Each of four exemplary films is a metal nitride film ($MN_1$–$MN_4$) stacked bottom to top in order of increasing electronic band gap energy value. The substrate 14 is shown to have devices 14a contained within a surface thereof, such as transistors. Metal interconnects 14b are formed on a surface of the substrate 14 for contacting the devices 14a. Within the film $MN_1$ are formed metal features or regions 12' for contacting the interconnects 14b. The film $MN_2$ also contains two metal regions 12" for contacting the metal regions 12'. The film $MN_3$ contains one metal region 12'" that conductively couples the metal regions 12" together and thus also the two devices 14a. The film $MN_4$ does not contain any metal regions, and thus functions solely as a passivation layer. It is clear that a multilevel interconnect system can be fabricated in situ using the teachings of this invention, by varying the wavelength of the radiation so as to selectively form the metal regions 12 within various ones of the films. It can be realized that the metal region 12'" may function as an anti-fuse that is written after the two devices 14a are separately tested. In this case the two devices 14a may be tested again after being connected, and if desired the metal region 12'" can be left in place, or can be removed.

In this manner the passivation layer in accordance with this invention can also be used for achieving a flexible personalization and repair of circuits on a chip. By passing the laser beam through a laser-microscope, small regions of the desired passivation layer can be selectively converted to metallic regions, thus providing a means for interconnecting circuits. The use of AlN, which is transparent over a wide range of wavelengths, is particularly well suited for this purpose. If the produced interconnection is deemed not necessary at a future stage, or is required to be later changed, then it can easily be deleted by ablation of the line using the same laser, but operating at a higher power. An interconnect can subsequently be provided in a different region of the chip. This enables one to make "add once/delete once" antifuse/fuse applications, unlike the "delete once only" fuses that are currently in use in microelectronic chips. These latter fuses usually consist of thin strips of aluminum wiring fabricated to lie beneath a transparent window of an insulator, such as silicon dioxide, which are provided in several areas of the chip. Customized wiring nets are achieved by selectively deleting appropriate Al fuses by ablating them with a suitable laser pulse through the oxide layer. In contrast, and in accordance with an aspect of this invention, one is enabled to connect wiring terminations to form customized nets and also to eliminate these connections later if so required.

In general, an anti-fuse may be considered as a fuse that is initially an open circuit, and that is then subsequently closed. For example, and as was discussed with regard to FIG. 6, it may be desirable to first test a circuit without a connection between two points, and to then later test the circuit with the connection. In this case, and in accordance with this invention, the two circuit points have an overlying layer of MN, such as AlN, which functions as a high quality passivation layer. After testing the circuit a laser is used to draw a conductive connection between the two points, thus closing the anti-fuse, and the circuit is tested again. The anti-fuse can subsequently be left closed, or can be open circuited by laser ablation, mechanical cutting or scribing, or by any suitable technique.

Further in accordance with the teachings of this invention the optical radiation metallization technique may also be used to create embedded resistors of arbitrary resistance within an insulating MN matrix. This can be done by applying the UV laser energy on the insulating nitride surface to create a conducting metal channel. In addition to interconnects, resistors of different values are typically required as part of a circuit. For example, impedance tuned transmission lines in chip and packaging interconnect structures can result in unwanted reflections of signals at the termination points of wiring nets causing degradation of signal quality. Terminating resistors are typically used to damp out these unwanted reflections. Depending on the type of microelectronic device, these terminating resistors can be discrete components attached to the top surface of a module as in circuit boards or ceramic multichip modules or metallic alloy or metal/ceramic composite films of precise dimensions as in the case of chip interconnections.

The UV metallization method taught by this invention can also be employed to fabricate a tunable resistor in these and other types of devices. In this aspect of the invention one uses a compound or a mixture of two compounds that upon metallization separate out into two or more phases, at least one of which is conducting, and at least one of which is insulating.

In a first method one can either vary the length and/or the width of the metallization channel, since the resistance is given by $R=\rho L/wd$, where L is the length of the channel, w is its width, and d is the metallization depth. By example, and referring again to FIG. 6, the metal region 12''' may have a length and/or width selected so as to form a resistor with a desired ohmic value between the devices 14a.

In accordance with a second method, one can vary the composition of the insulating layer by deposition of, for example, a compound such as AlON, or AlSiN, or a mixture of $Al_xO_y$ and AlN or $Si_xN_y$ and AlN. In this embodiment, if the starting thin film is an intimate mixture of the above mentioned compounds, then upon metallization one is left with an intimate mixture of a metal (Al) and a ceramic ($Si_xN_y$ or $Al_xO_y$), resulting in the formation of a cermet. Consequently, the resistance of such a cermet will vary depending upon the relative amounts of metal and ceramic.

In yet another method, one can deposit a compound such as AlXN, where X is a second metal such as Ga, In or the like, whose nitride is also amenable to the UV radiation induced metallization described above. In this case, a mixture or alloy of Al and the metal X results whose resistivity can be varied by varying the proportion of Al and X in the initial nitride layer. An optional post-deposition thermal annealing process may be used to homogenize and adjust the resistance value of the metallization.

It is also possible to perform the metallization of pure AlN in a controlled oxygen ambient, which can partially convert the Al to $Al_2O_3$ during the conversion process by partially oxidizing the Al.

In all of the above cases, fine adjustment of the resistance value can be achieved by trimming the in-plane dimensions of the metallization pattern using methods known in the art, such as YAG laser trimming. The compounds mentioned above have been used as examples only, and it should readily occur to those skilled in the art that there are numerous compounds from which one can choose from without deviating from the teachings of this invention.

While the invention has been particularly shown and described with respect to preferred embodiments thereof, it will be understood by those skilled in the art that changes in form and details may be made therein without departing from the scope and spirit of the invention.

What is claimed is:

1. A structure comprising a plurality of metal nitride dielectric films disposed in a multilayer stack with embedded metal regions present in some or all of the metal nitride films, each metal nitride film being of the form MN, where M is selected from the group consisting of Ga, In, AlGa, AlIn, and AlGaIn, said structure having at least one electrically conductive metal region that is formed within and from a metal nitride film by a thermal process; wherein the stack of metal nitride films is arranged from bottom to top in order of increasing electronic band gap energy value.

2. A structure as in claim 1, wherein said metal region extends from a top surface to a bottom surface of a metal nitride film.

3. A structure as in claim 1, wherein the at least one said metal region is conductively coupled to an electrically conductive feature disposed beneath or within the metal nitride film.

4. A structure as in claim 1, wherein the at least one metal region is conductively coupled between a first electrically conductive feature and a second electrically conductive feature that are disposed beneath or within the metal nitride film.

5. A structure as in claim 4, wherein the at least one said metal region forms an electrically conductive via within a microelectronic device.

6. A structure as in claim 4, wherein the at least one said metal region forms an electrically conductive via within a multilayer packaging module.

7. A structure as in claim 4, wherein the at least one said metal region forms a fused connection in an electronic circuit to allow customization and repair of circuit interconnections.

8. A structure as in claim 1, wherein said at least one electrically conductive metal region is formed by selective exposure of said metal nitride film to irradiation with ultraviolet light photons having a wavelength selected to cause a conversion from the metal nitride to the metal or metals that comprises the metal nitride.

9. A structure as in claim 8, wherein said irradiation is provided by a laser source that is selectively applied through an apertured mask to the metal nitride film or that is selectively scanned over the metal nitride film.

10. A structure according to claim 1, wherein the embedded metal regions are fabricated by radiating the multilayer metal nitride film stack with selected wavelength ultraviolet radiation photons so that conversion of the metal nitride to metal is accomplished in selected films.

11. A structure according to claim 1, wherein at least some of said embedded metal regions are contiguous from top to bottom and are in physical contact with metal regions in adjacent films so as to provide a continuous path for electrical conduction.

12. The structure of claim 1, wherein at least some of said embedded metal regions are used for interlevel connections in one of a microelectronic chip or a multilayer packaging module.

13. The structure of claim 1, wherein at least some of said metal regions are anti-fuse connections that allow customization and repair of circuit interconnections.

14. The structure of claim 1, wherein said metal nitride dielectric film is selectively converted to metal between existing circuitry on a microelectronic device for providing interconnection between circuitry.

15. The structure of claim 1, wherein at least one of said metal nitride films is selectively converted to metal between existing circuitry on a microelectronic device for providing interconnection between the said circuitry.

16. The structure of claim 1, wherein at least one of a length or a width of a metal region is selected for imparting a predetermined electrical resistance value to said metal region.

17. The structure of claim 1, wherein a composition of said metal nitride dielectric film is selected for imparting a predetermined electrical resistance value to a metal region.

18. The structure of claim 1, wherein a composition of a metal region is varied during the formation of said metal region for imparting a predetermined electrical resistance value to said metal region.

19. The structure of claim 18, wherein a metal region is partially oxidized during the formation of the metal region for imparting a predetermined electrical resistance value to said partially oxidized metal region.

20. The structure of claim 1, wherein M is aluminum and at least one electrically conductive region consists of aluminum.

21. The structure of claim 1, wherein M comprises aluminum and the at least one electrically conductive region comprises aluminum.

22. An electrical device comprising at least one thin film of a metal alloy of composition $A_xB_yC_{1-x-y}N$ disposed over a substrate, where A, B, and C are different column III metals, x and y are numbers between 0 and 1, and N is nitrogen, said at least one thin film comprising at least one electrically conducting interconnect metal region formed from one or more of said metals.

23. An electrical device as in claim 22 wherein A is indium, B is gallium and C is aluminum.

24. A method for forming an electrically conductive feature within a circuit structure, comprising steps of:

providing a plurality of metal nitride dielectric films disposed in a multilayer stack arranged from bottom to top in order of increasing electronic band gap energy value, the metal nitride films being of the form MN, where M is selected from the group consisting of Ga, In, AlGa, AlIn, and AlGaIn;

selectively illuminating the at least one film with light having a predetermined wavelength; and forming at least one electrically conductive metal-containing region within the selectively illuminated film from the metal nitride film;

wherein the step of selectively illuminating is accomplished a plurality of times using different wavelengths such that conversion of the metal nitride to metal is accomplished in selected films.

* * * * *